United States Patent [19]

Shikatani

[11] Patent Number: 5,253,207
[45] Date of Patent: Oct. 12, 1993

[54] SEMICONDUCTOR MEMORY DEVICE HAVING DUAL PORTS

[75] Inventor: Junichi Shikatani, Kawasaki, Japan

[73] Assignee: Fujitsu Limited, Kanagawa, Japan

[21] Appl. No.: 793,968

[22] Filed: Nov. 18, 1991

[30] Foreign Application Priority Data

Nov. 20, 1990 [JP] Japan .................. 2-312784

[51] Int. Cl.⁵ .............................................. G11C 7/00
[52] U.S. Cl. .......................... 365/189.04; 365/230.05; 365/233.5
[58] Field of Search ........................ 365/189.04, 189.01, 365/189.03, 230.05, 233.5

[56] References Cited

U.S. PATENT DOCUMENTS

| 4,586,168 | 4/1986 | Adlhoch et al. | 365/189.04 |
| 4,660,177 | 4/1987 | O'Connor | 365/189.04 |
| 4,918,664 | 4/1990 | Platt | 365/233.5 |
| 4,933,909 | 6/1990 | Cushing et al. | 365/189.04 |
| 5,001,671 | 3/1991 | Voo et al. | 365/233.5 |
| 5,007,022 | 4/1991 | Leigh | 365/189.04 |

FOREIGN PATENT DOCUMENTS 0149049 7/1985 European Pat. Off.
0288860 11/1988 European Pat. Off.
1-290189 11/1989 Japan.

Primary Examiner—Eugene R. LaRoche
Assistant Examiner—Tan Nguyen
Attorney, Agent, or Firm—Nikaido, Marmelstein, Murray & Oram

[57] ABSTRACT

A semiconductor memory device in which dual ports are provided for selecting a specific memory cell from a memory cell matrix includes a driving state detection unit for detecting the state of driving word lines of the two ports and delivering a detection signal based on the detection, where one of the ports is in the writing state with regard to the memory cell, and a bit line short-circuiting unit responsive to the detection signal from the driving state detection unit for realizing a short-circuit between predetermined bit lines.

3 Claims, 14 Drawing Sheets

IN CASE OF DATA WRITING

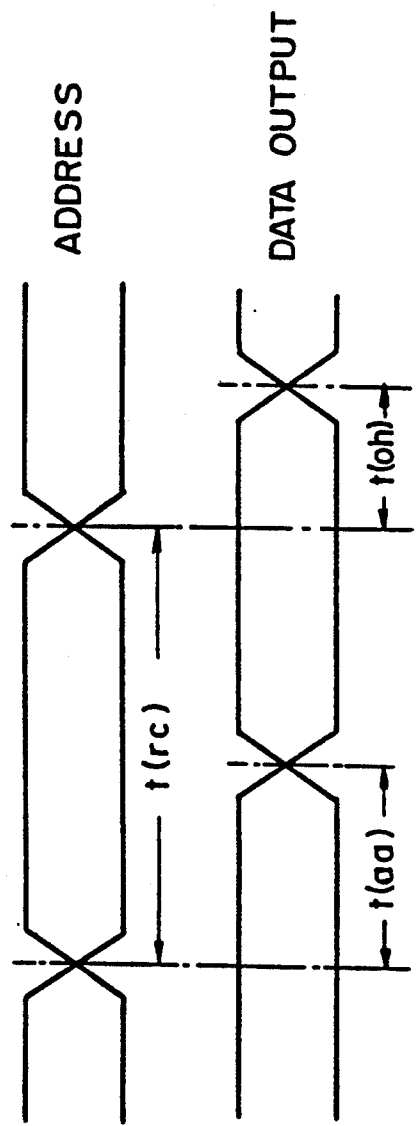

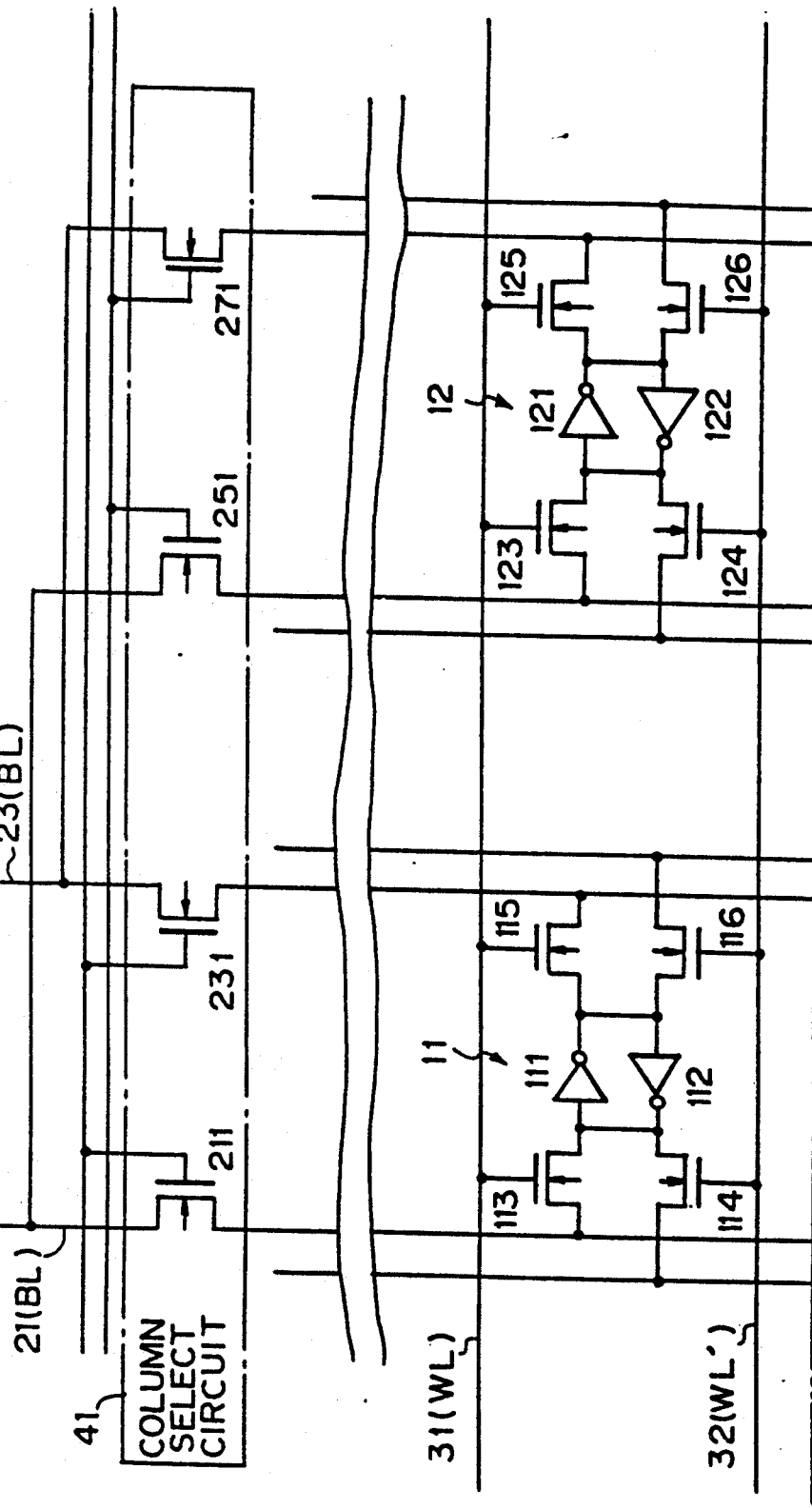

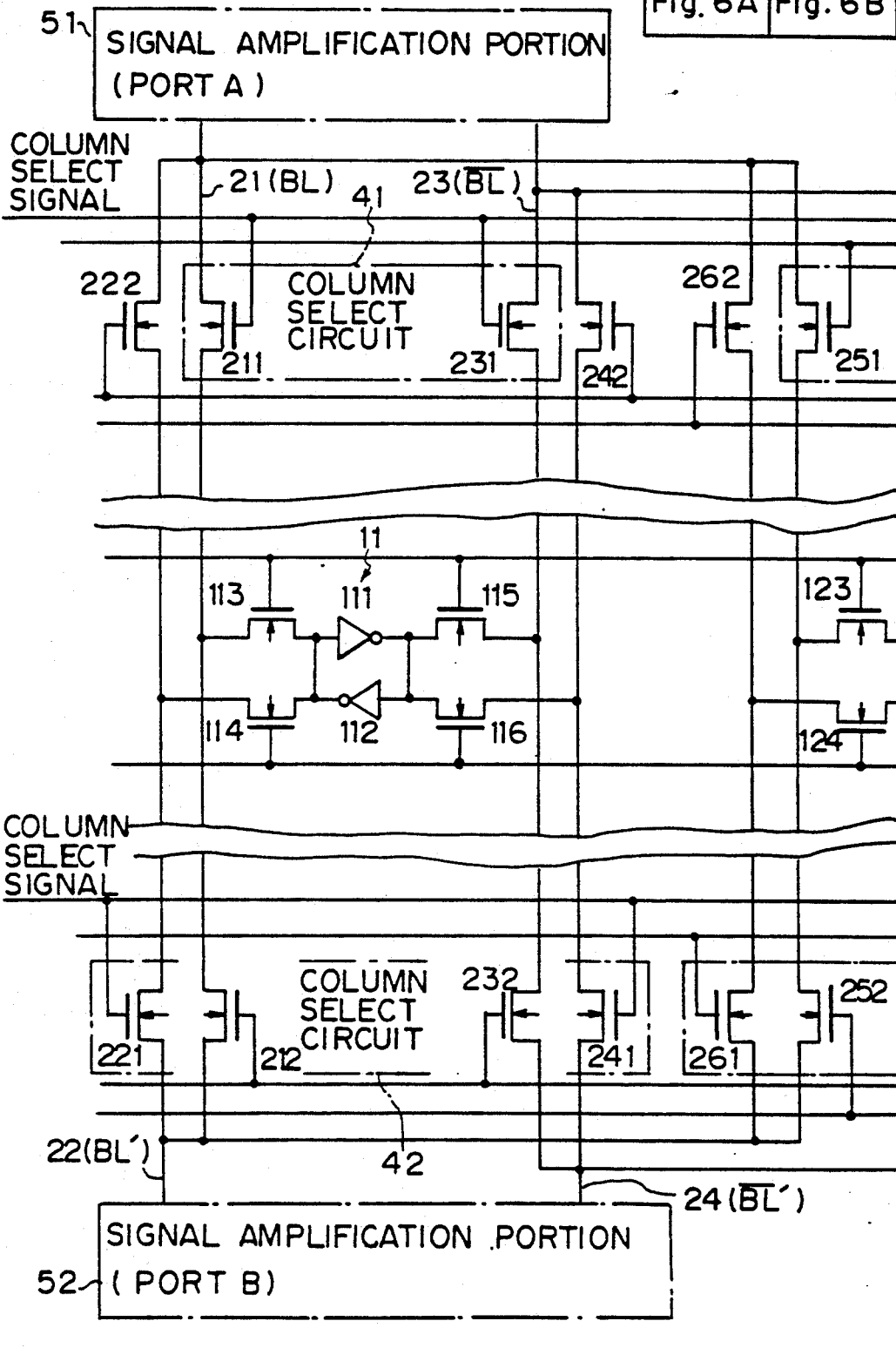

Fig. 7
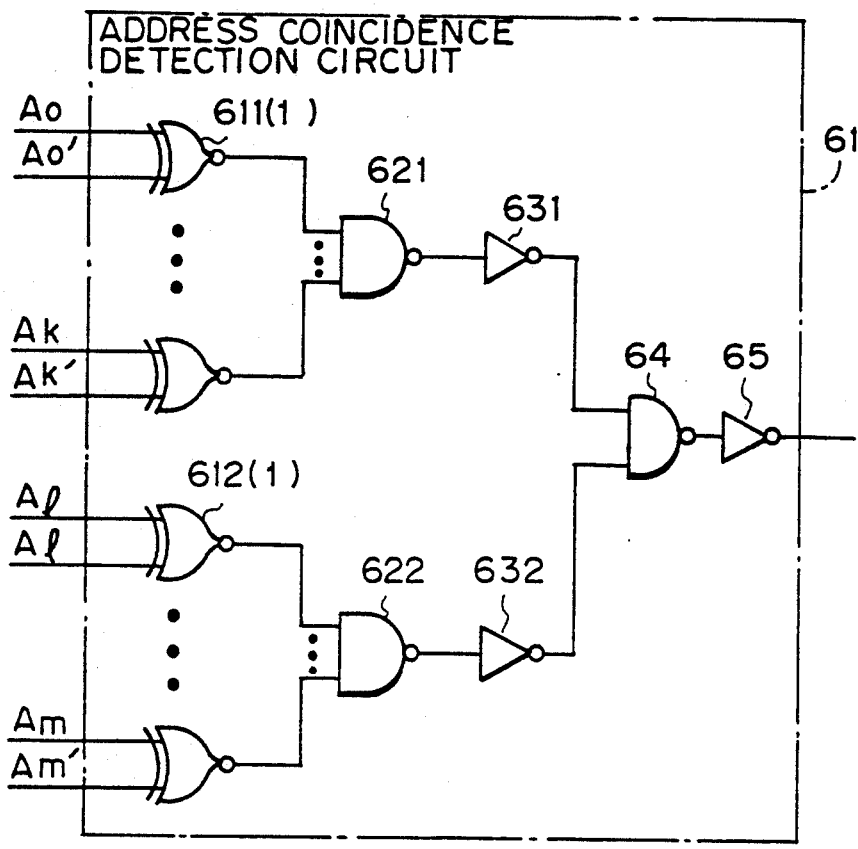
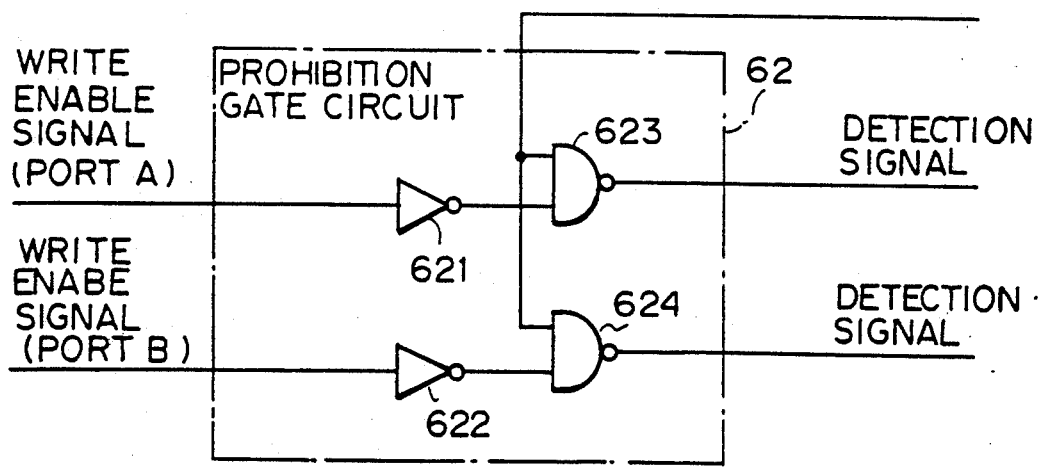

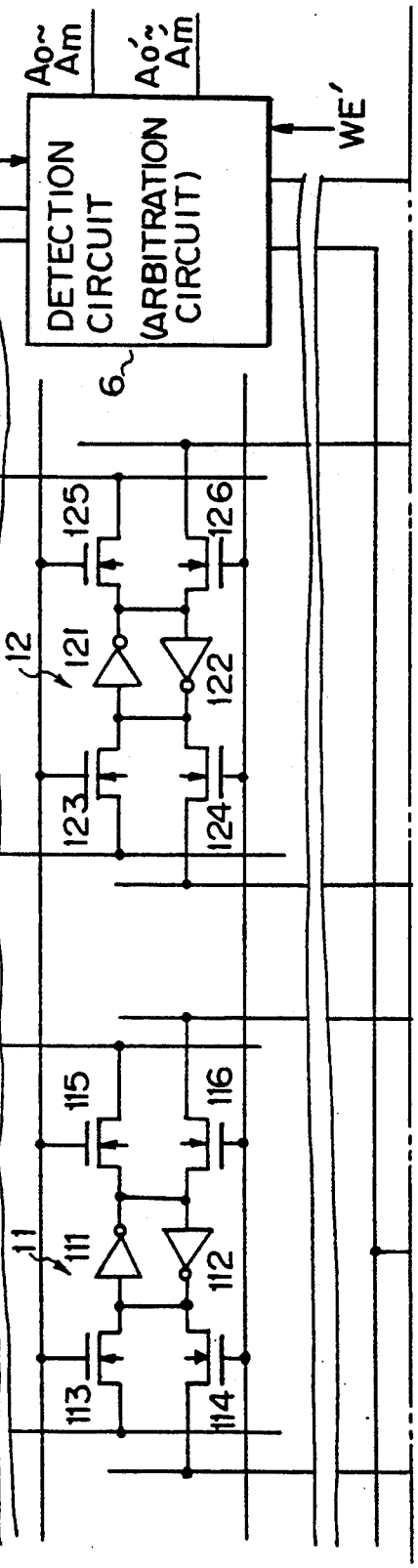

SEMICONDUCTOR MEMORY DEVICE HAVING DUAL PORTS

BACKGROUND OF THE INVENTION

1. Field of the Invention

The present invention relates to a semiconductor memory device having dual ports, such as a dual-port random access memory (dual-port RAM).

2. Description of the Related Arts

In a dual-port random access memory device, it is possible to write data into a memory cell of a memory cell matrix through one port while data is read from a memory cell of a memory cell matrix through the other port. Thus, the speed of access to the data is increased, and an exchange of data between two similar memory systems having the dual-port random access memory in common is carried out quickly.

In a prior art dual-port random access memory device, word lines and bit lines of each of the two ports are driven independently, and a specific memory cell is selected for each of the two ports. Where one port is in the writing state and the row address of the memory cells selected by both ports is the same row address, i.e., data is written into a memory cell from one side port (e.g., port A) and the word lines of both sides are accessed, all transfer gates of the memory cell are in the conductive state. In this case, when a data writing is carried out, a portion of the current is passed from the bit line of one side port (e.g., port A) through the transfer gate to the bit line of the other side port (e.g., port B). Where the other side port (e.g., port B) is in the reading state and the data in the memory cell is to be reversed by the bit line of the side of the one side port (e.g., port A), it is necessary to reverse the potential of the bit line of the side of the other side port (e.g., port B) and to supply the drive current for the potential reversal from the side of the one side port (e.g., port A).

In a prior art dual-port random access memory device, the transfer gate of the memory cell is generally constituted by MOS type transistors having a high resistance even in the conductive state, and thus a capacitance against the ground of the bit lines of the side of the other side port (e.g., port B) exists, and accordingly, the time constant for the potential reversal is prolonged. In consequence, a problem arises in that the time required for writing data becomes longer than usual, and accordingly, the data writing speed is reduced.

SUMMARY OF THE INVENTION

An object of the present invention is to provide an improved semiconductor memory device in which, even where one side port is in the writing state with regard to a specific memory cell and the word line of the specific memory cell is accessed simultaneously from both ports, a reduction of the data writing speed is prevented and the time needed for writing data is shortened.

In accordance with the present invention, there is provided a semiconductor memory device in which dual ports are provided for selecting a specific memory cell from a memory cell matrix, and word lines and bit lines in the ports of the dual ports are driven independently for each port to write data into or read data from the memory cell, said device comprising:

a driving state detection unit for detecting a driving state of word lines of the two port sides and delivering a detection signal based on the detection, where one of the ports is in the writing state with regard to the memory cell; and a bit line short-circuiting unit responsive to the detection signal from the driving state detection unit for realizing a short-circuit between predetermined bit lines.

It is possible to arrange the bit line short-circuiting unit, responsive to the detection signal from the driving state detection unit, to realize a short-circuit state between a bit line of the side of one port and a bit line of the side of the other port. It is also possible to arrange the bit line short-circuiting unit, responsive to the detection signal from the driving state detection unit, to realize a short-circuit state of bit line pair of the side of the port opposite to the port of the writing side.

BRIEF DESCRIPTION OF THE DRAWINGS

FIG. 3 shows the waveforms of the signals in the device of FIG. 1 when reading data;

FIG. 4A and 4B show the structure of the main part of a prior art semiconductor memory device;

FIG. 6A and 6B show details of the structure of the device shown in FIG. 5;

FIG. 7 shows an example of the structure of the detection circuit in the device of FIG. 6;

FIG. 11A and 11B show details of the structure of the device shown in FIG. 10.

DESCRIPTION OF THE PREFERRED EMBODIMENTS

Figure 1:
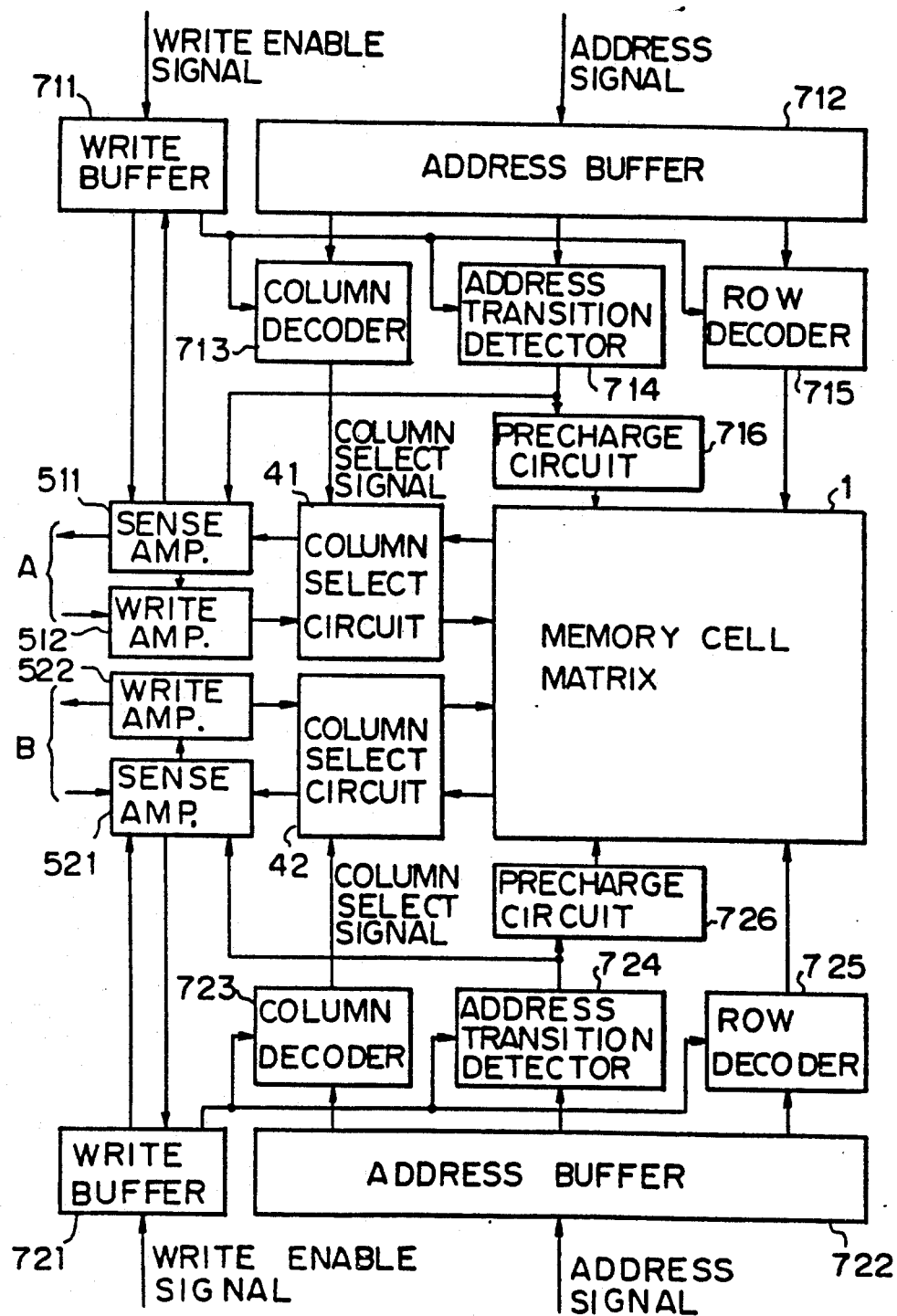
FIG. 1 shows the structure of a prior art dual-port random access memory device.

Before describing the preferred embodiments, a prior art dual-port RAM device is explained with reference to FIGS. 1 to 4. In a prior art dual-port RAM device shown in FIG. 1, the port A is provided with a write buffer 711, an address buffer 712, a column decoder 713, an address transition detector 714, a row decoder 715, and a precharge circuit 716, and the port B is provided with a write buffer 721, an address buffer 722, a column decoder 723, an address transition detector 724, a row decoder 725, and a precharge circuit 726. A sense amplifier 511 and write amplifier 512 of the port A are connected through a column select circuit 41 to a memory cell matrix 1, and a sense amplifier 521 and write amplifier 522 of the port B are connected through a column select circuit 42 to a memory cell matrix 1.

When a write enable signal is supplied through a write buffer 711 to a row decoder 715 and, column decoder 713, etc., a writing of data to a selected memory cell is started.

Figure 2:
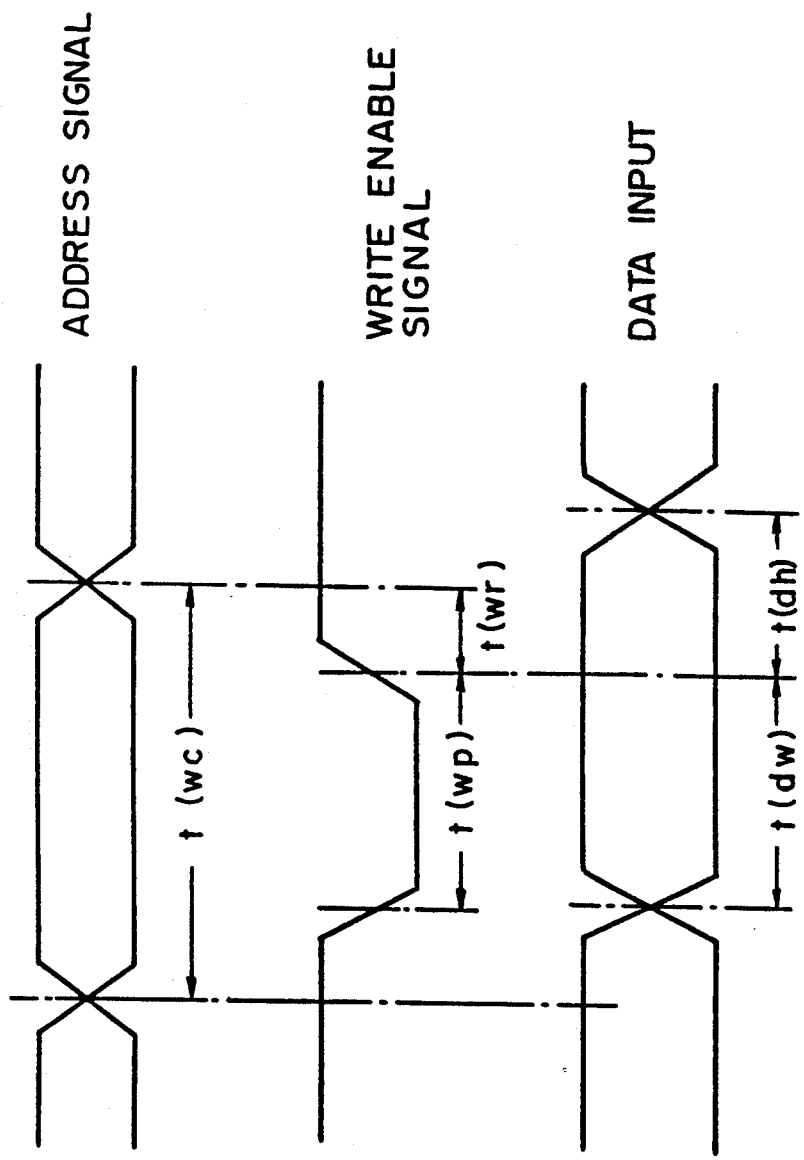
FIG. 2 shows the waveforms of the signals in the device of FIG. 1 when writing data.

The waveforms of the signals in the device of FIG. 1 are shown in FIGS. 2 and 3. The waveforms of the address signal, the write enable signal, and the data input are shown in FIG. 2. The time t(wc) represents the pulse width of the address signal during data writing. The level of potential of the address is HIGH or LOW in accordance with the change of the address. The time t(wp) represents the period of LOW level of write enable signal during which a writing of data is possible. The time t(wr) is a period for defining the rise of a write enable signal. The level of the write enable signal must be HIGH upon a change of the address signal. The time t(dw) represents the writing period required for at least writing data after the determination of the address. The time t(dh) represents a period for which the written data is held.

The waveforms of the address signal, and the data output are shown in FIG. 3. The time t(rc) represents the pulse width of the address signal during data reading. The time t(aa) represents the period required for becoming at least capable of reading after the determination of the address. The time t(oh) represents the period of for which the read data is held.

Figure 4B:
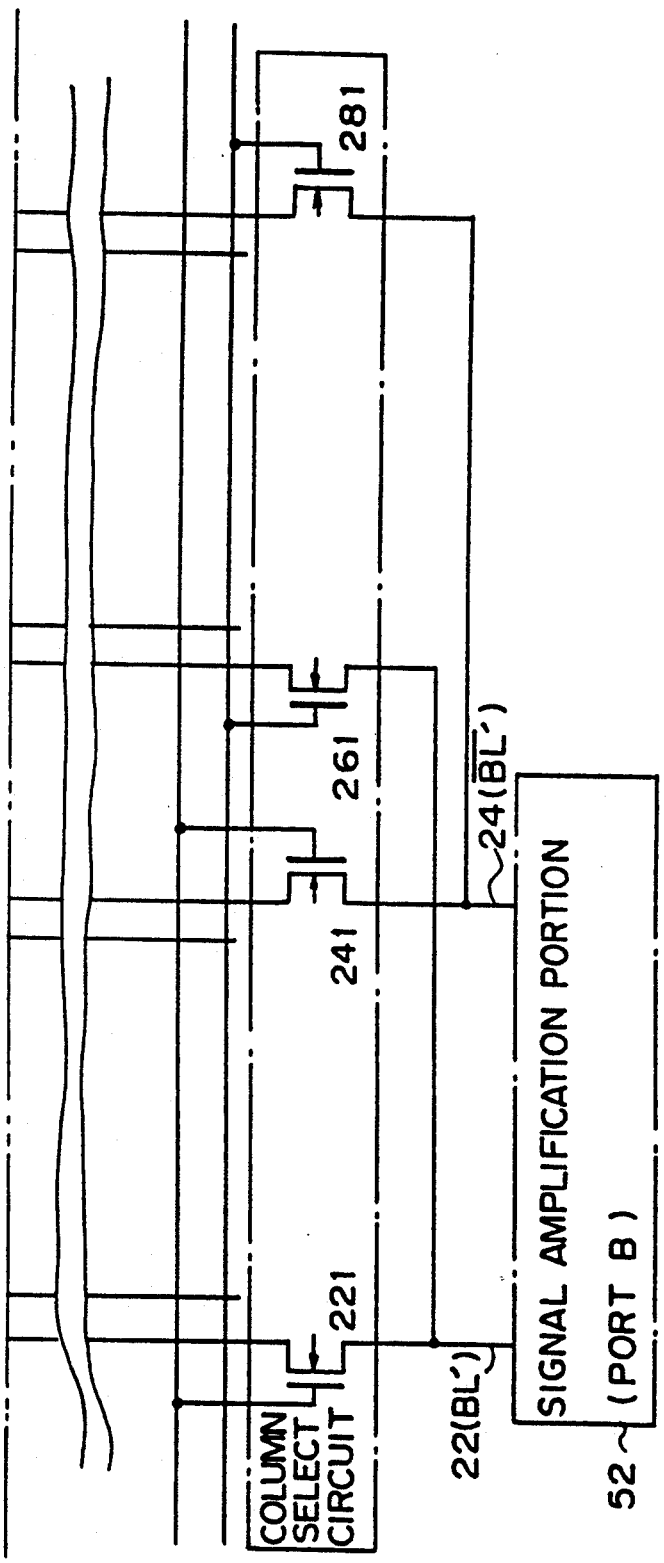

The structure of the main part of a prior art semiconductor memory device applicable to the dual-port RAM device of FIG. 1 is shown in FIG. 4. The memory cell 11 is constituted by a flip-flop circuit consisting of two inverters 111 and 112, and four transfer gates 113, 114, 115, and 116. The memory cell 12 is constituted by a flip-flop circuit consisting of two inverters 121 and 122, and four transfer gates 123, 124, 125, and 126. A signal amplification portion 51 including a write amplifier and a sense amplifier is provided as port A, and a signal amplification portion 52 including a write amplifier and a sense amplifier is provided as port B. A bit line pair 21(BL) and 23($\overline{BL}$) is connected to the signal amplification portion 51, and a bit line pair 22(BL') and 24($\overline{BL}$') is connected to the signal amplification portion 52. A word line 31(WL) of port A and a word line 32(WL') of port B are provided for a row of a memory cell matrix. A word line 31(WL) is connected to transfer gates 113 and 115 of a memory cell 11, and a word line 32(WL') is connected to transfer gates 114 and 116. A flip-flop circuit 111 is connected through transfer gates 113 and 115 to bit lines 21(BL) and 23($\overline{BL}$), and a flip-flop circuit 112 is connected through transfer gates 114 and 116 to bit lines 22(BL') and 24($\overline{BL}$'). A column select circuit 41 constituted by switching elements 211, 231, 251, and 271 for driving bit lines 21(BL) and 23($\overline{BL}$) is inserted in the bit lines 21(BL) and 23($\overline{BL}$). A column select circuit 42 constituted by switching elements 221, 241, 261, and 281 for driving bit lines 22(BL') and 24($\overline{BL}$') is inserted in the bit lines 22(BL') and 24($\overline{BL}$'). Switching elements 211, 231, 251, and 271 are driven by a column select signal of port A, and switching elements 221, 241, 261, and 281 are driven by a column select signal of port B.

Data is written from a write amplifier in a signal amplification portion through a bit line pair to a selected memory cell, and the data is read from a selected memory cell based on the detection of the potential difference of a bit line pair by a sense amplifier in a signal amplification portion.

The driving of the word lines and the bit lines for data writing on data reading can be carried out independently for each of port A and port B, but a simultaneous writing of data to the same memory cell from both port A and port B is prohibited.

In the device of FIG. 4, where data is to be written to a memory cell 11 from port A, and word lines 31 and 32 of both the port A side and port B side are accessed, all transfer gates 113, 115, 114, and 116 of the memory cell 11 are in the conductive state, and when the data is written, a part of the current passes from a bit line 21 through transfer gates 113 and 114 to a bit line 22. When the port B side is in the reading state and the data in the memory cell 11 is to be reversed by bit lines 21 and 23 of port A, the potentials of bit lines 22 and 24 must be reversed, and the drive current through the bit line for potential reversal must be supplied from port A.

Note, a transfer gate of a memory cell is constituted by a MOS transistor having a high resistance even in the conduction state, and the bit lines 22 and 24 of the port B side have a capacitance with respect to the ground. Under such conditions, the time constant of the circuit is prolonged, and the time needed for the potential reversal becomes long. This causes a problem in that the time required for writing data is prolonged and thus the data writing speed is lowered.

Figure 5:
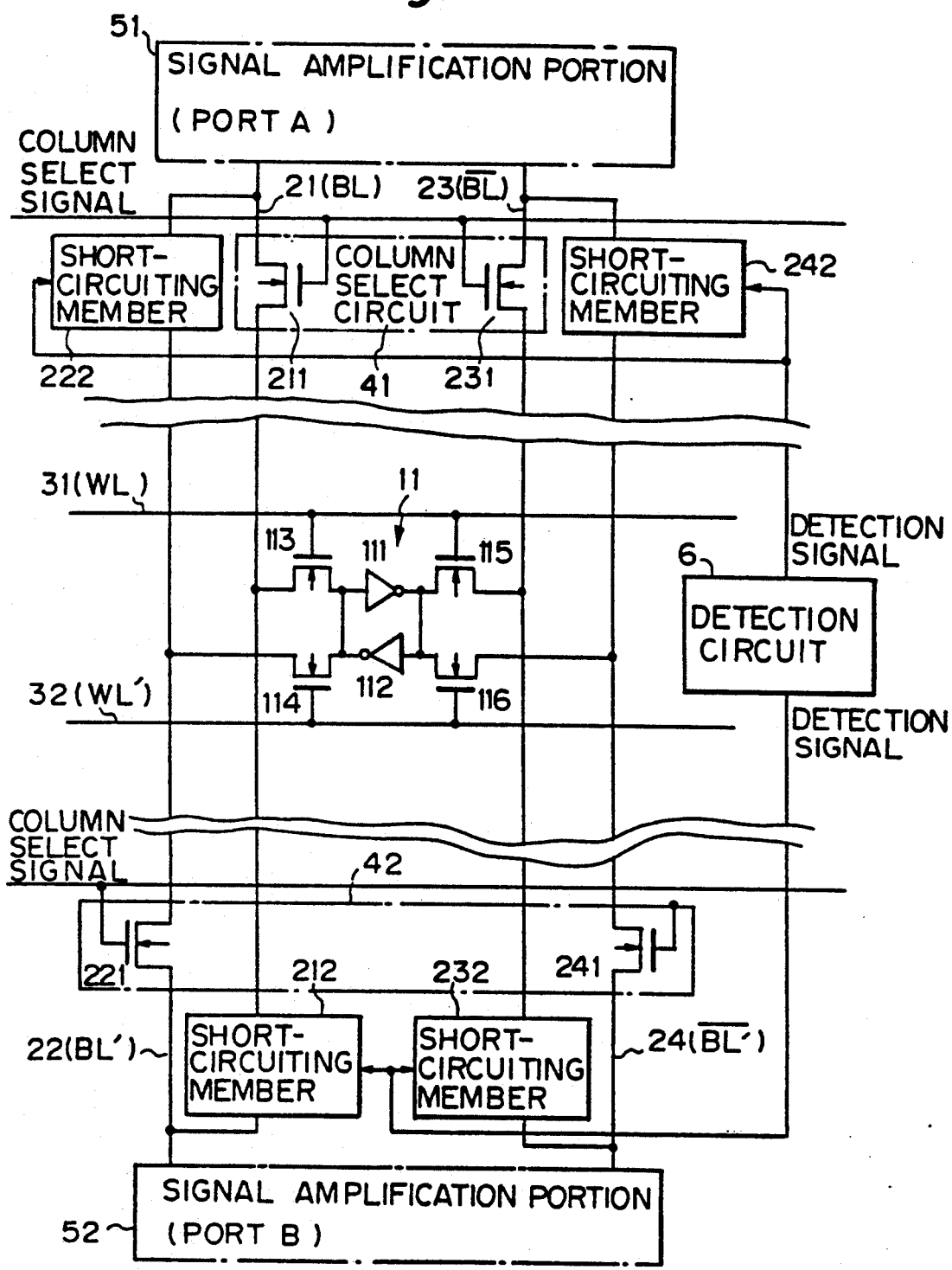
FIG. 5 shows the structure of the main part of the semiconductor memory device according to an embodiment of the present invention.

The structure of the main part of the semiconductor memory device according to an embodiment of the present invention is shown in FIG. 5. A detailed structure of the device of FIG. 5 is shown in FIG. 6.

The device shown in FIG. 5, is provided with a detection circuit 6 for detecting a driving of the word lines 31 and 32 of both port A and port B, where one port is in the writing state and delivering detection signals, and short-circuiting members 212, 222, 232, and 242 in response to the delivered detection signals and short-circuiting the bit lines 21, 22, 23, and 24 of both port A and port B.

When the bit lines 21 and 22 are short-circuited, the transfer gates 113 and 114 are connected in parallel, and the resultant resistance of the transfer gates 113 and 114 is a half of the resistance of one transfer gate, and thus the resultant capacitance of the transfer gates 113 and 114 is increased. Since the effect of the reduction of the resistance is greater than the effect of the increase of the capacitance, the change of the time constant of the circuit is greater upon a reduction of the resistance than upon an increase of the capacitance, and accordingly, the time constant of the circuit is shortened, and thus the time required for data writing is effectively shortened.

Figure 6B:
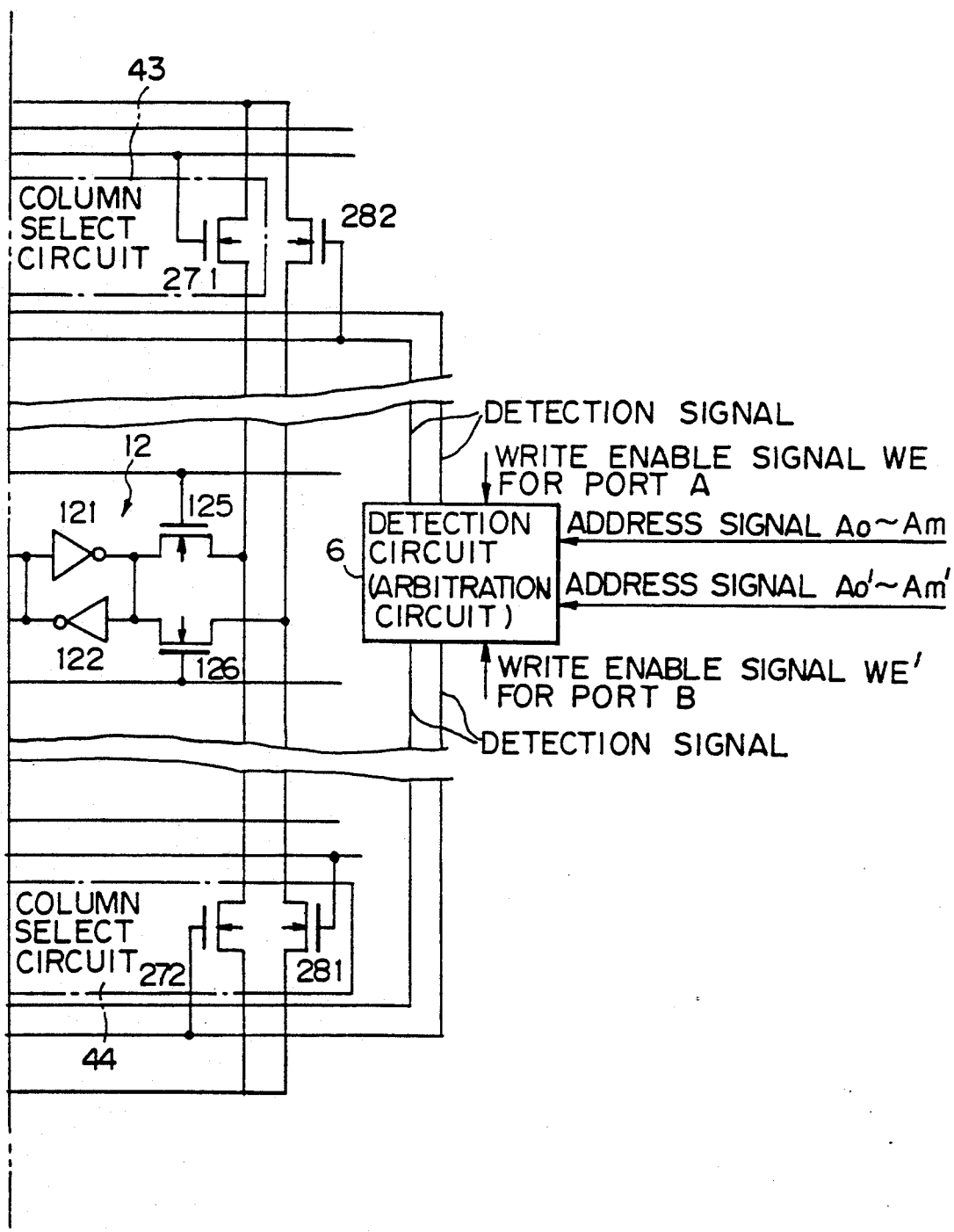

The detailed structure of the device of FIG. 5 is shown in FIG. 6, in which only memory cells 11 and 12 are shown as representative of the memory cells. A column select circuit 41 having switching elements 211 and 231, and a column select circuit 42 having switching elements 221 and 241 are provided for the memory cell 11, and a column select circuit 43 having switching elements 251 and 271 and a column select circuit 44 having switching elements 261 and 281 are provided for the memory cell 12. The switching elements 211, 231, 221, 241, 251, 271, 261, and 281 in the column select circuits are made conductive based on the selection by column selection signals, and column address is designated accordingly.

The short-circuiting members in the device of FIG. 6 are constituted by a switching circuit consisting of switching elements 222 and 212 for short-circuiting bit lines 21(BL) and 22(BL') and a switching circuit consisting of switching elements 242 and 232 for short-circuiting bit lines 23($\overline{BL}$) and 24($\overline{BL}$'), and further, are constituted by a switching circuit consisting of switching elements 262 and 252 for short circuiting bit lines BL and BL' and a switching circuit consisting of switching elements 282 and 272 for short-circuiting bit lines $\overline{BL}$ and $\overline{BL}$'.

A detection circuit 6, i.e., arbitration circuit 6, delivers detection signals for controlling the switching elements 222, 212, 242, 232, 262, 252, 282, and 272.

An example of the structure of the detection circuit 6 is shown in FIG. 7. The detection circuit is constituted by an address coincidence detection circuit 61 and a prohibition gate circuit 62, each constituted by a combination of logic elements. In the address coincidence detection circuit 61, address signals $A_0, \ldots A_k, A_1, \ldots A_m$ from port A are compared with address signals $A_0', \ldots A_k', A_1', \ldots A_m'$ from port B, and when these address signals coincide, the coincidence signal is made HIGH to thereby indicate that the word lines of both ports are accessed.

In the prohibition gate circuit 62, when the write enable signal of one side port has a LOW level potential representing an active state, i.e., the port of one side is in the writing state, the detection signal having a HIGH level potential is delivered, and because the detection signal has a HIGH level potential, switching elements such as the switching elements 222, 242, 262, and 282 are made conductive, whereby the bit line 21(BL) and bit line (BL') are short-circuited, and the bit line 23($\overline{BL}$) and bit line ($\overline{BL}'$) are also short-circuited.

In the device of FIG. 6, due to the short-circuiting of the bit lines of both ports, the time t(dw) (FIG. 2) for data writing is shortened even when the word lines of both ports are accessed. Namely, the time for data writing is greatly shortened, and thus the operation speed of the device is effectively increased.

Figure 8:
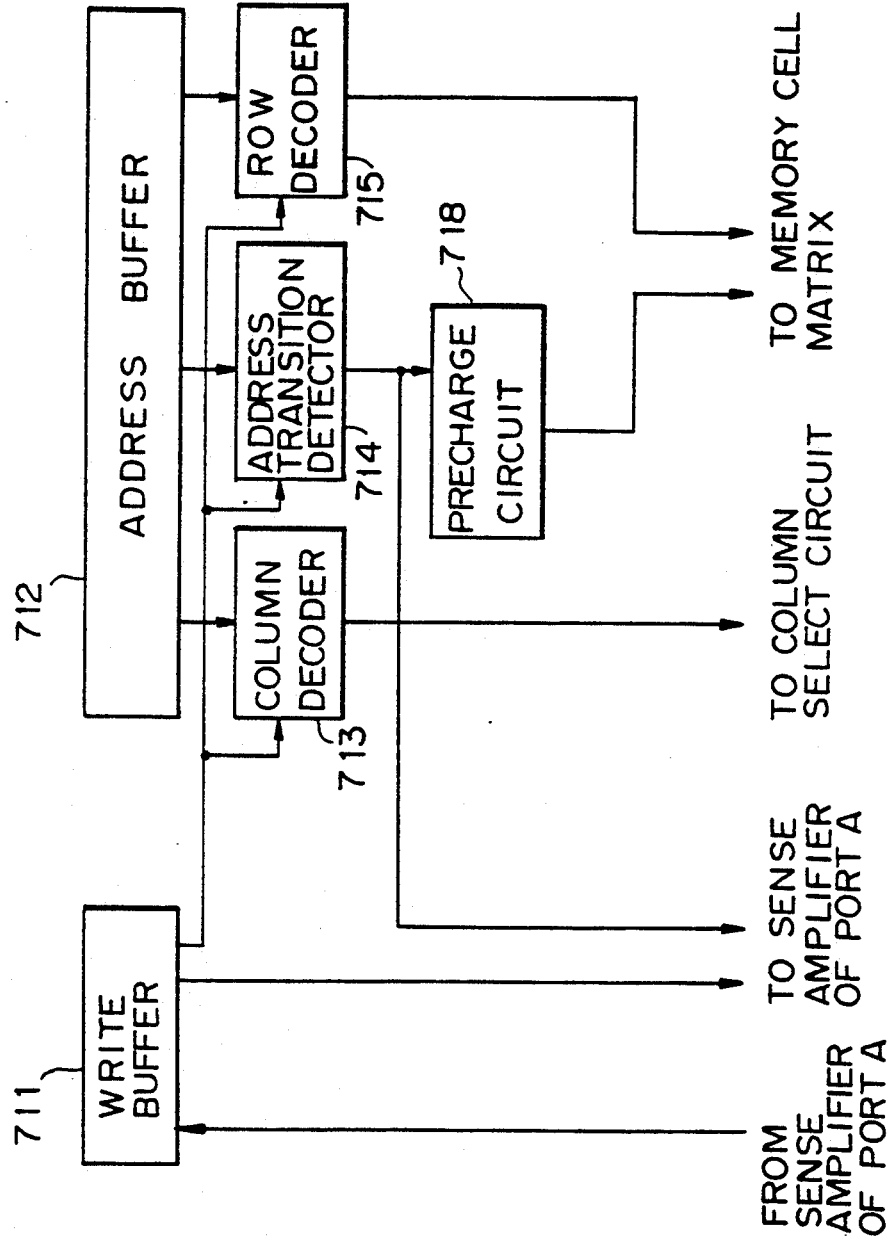
FIGS. 8 and 9 show the structures of the elements of the dual-port random access memory device to be connected to the device of FIG. 5.
Figure 9:
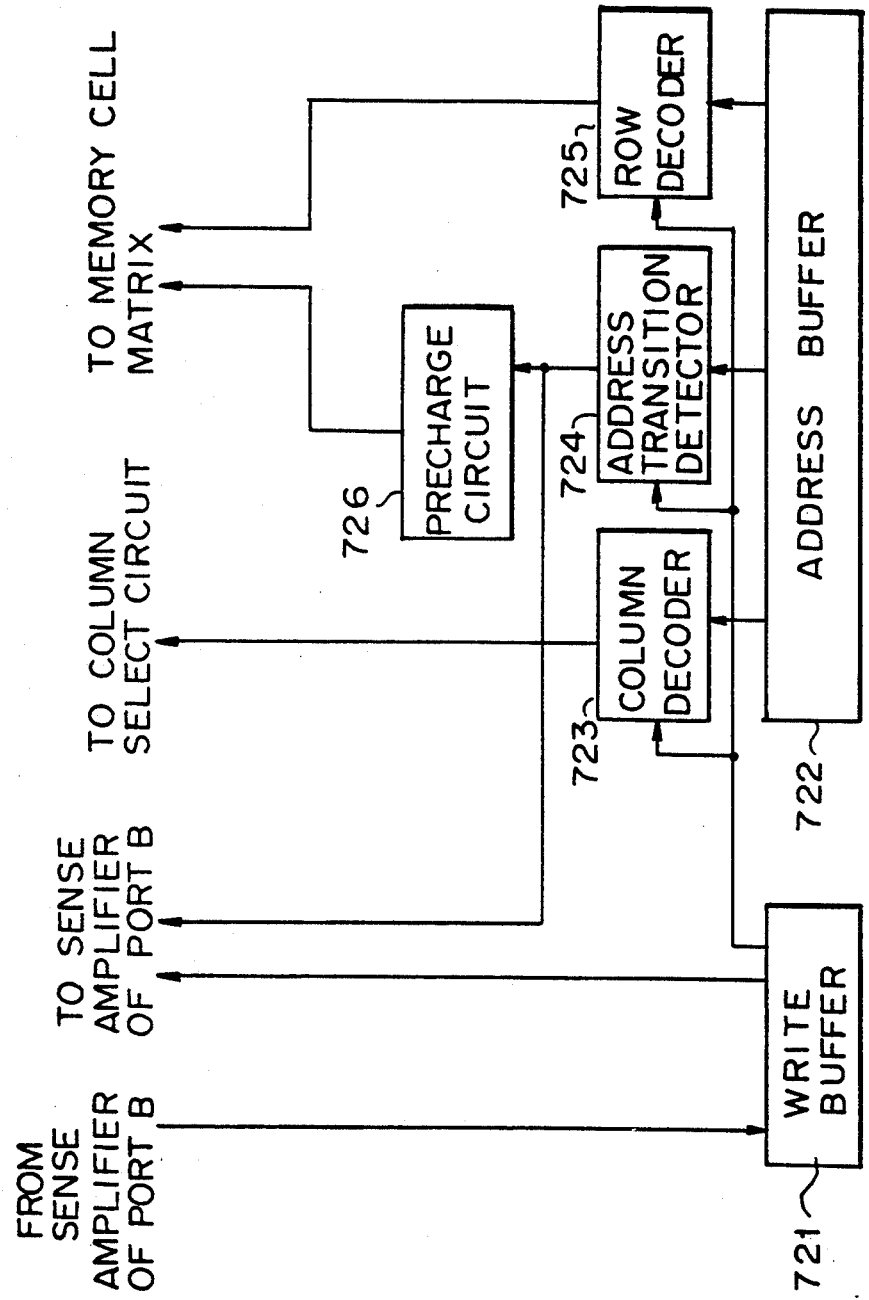

The structures of the elements of the dual-port random access memory device to be connected to the device of FIG. 5 are shown in FIGS. 8 and 9. The structures shown in FIGS. 8 and 9, are provided with write buffers 711, 721, address buffers 712, 722, column decoders 713, 723, address transition detectors 714, 724, row decoders 715, 725, and precharge circuits 716, 726.

Figure 10:
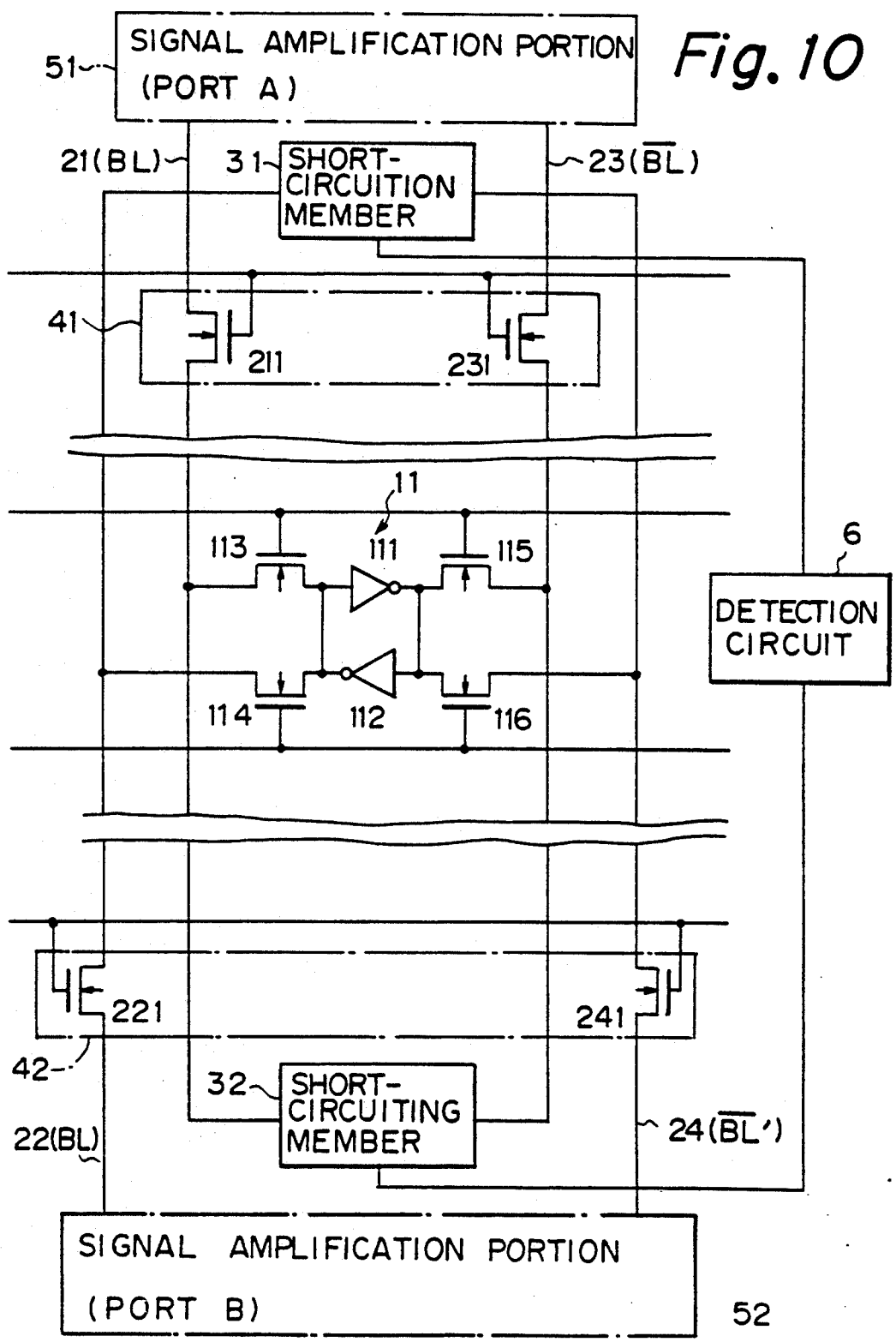
FIG. 10 shows the structure of the main part of the semiconductor memory device according to another embodiment of the present invention.

The structure of the main part of the semiconductor memory device according to another embodiment of the present invention is shown in FIG. 10. The detailed structure of the device of FIG. 10 is shown in FIG. 11.

In the device of FIG. 10, while the detection signal is delivered from detection circuit 6, a bit line pair 22(BL') and 24($\overline{BL}'$) of the port B which is opposite to port A having a bit line pair 21(BL) and 23($\overline{BL}'$) in the writing state, is short-circuited through a short-circuiting member 31. This short-circuiting causes the bit line pair 22(BL') and 24($\overline{BL}'$) of the opposite port to be brought to the same potential, and the influence of the bit line pair 22(BL') and 24($\overline{BL}'$) upon the bit line pair 21(BL) and 23($\overline{BL}$) in the writing state becomes negligible. Therefore, the time required for writing data is greatly shortened, and the operation speed of the device is effectively increased.

Figure 11B:
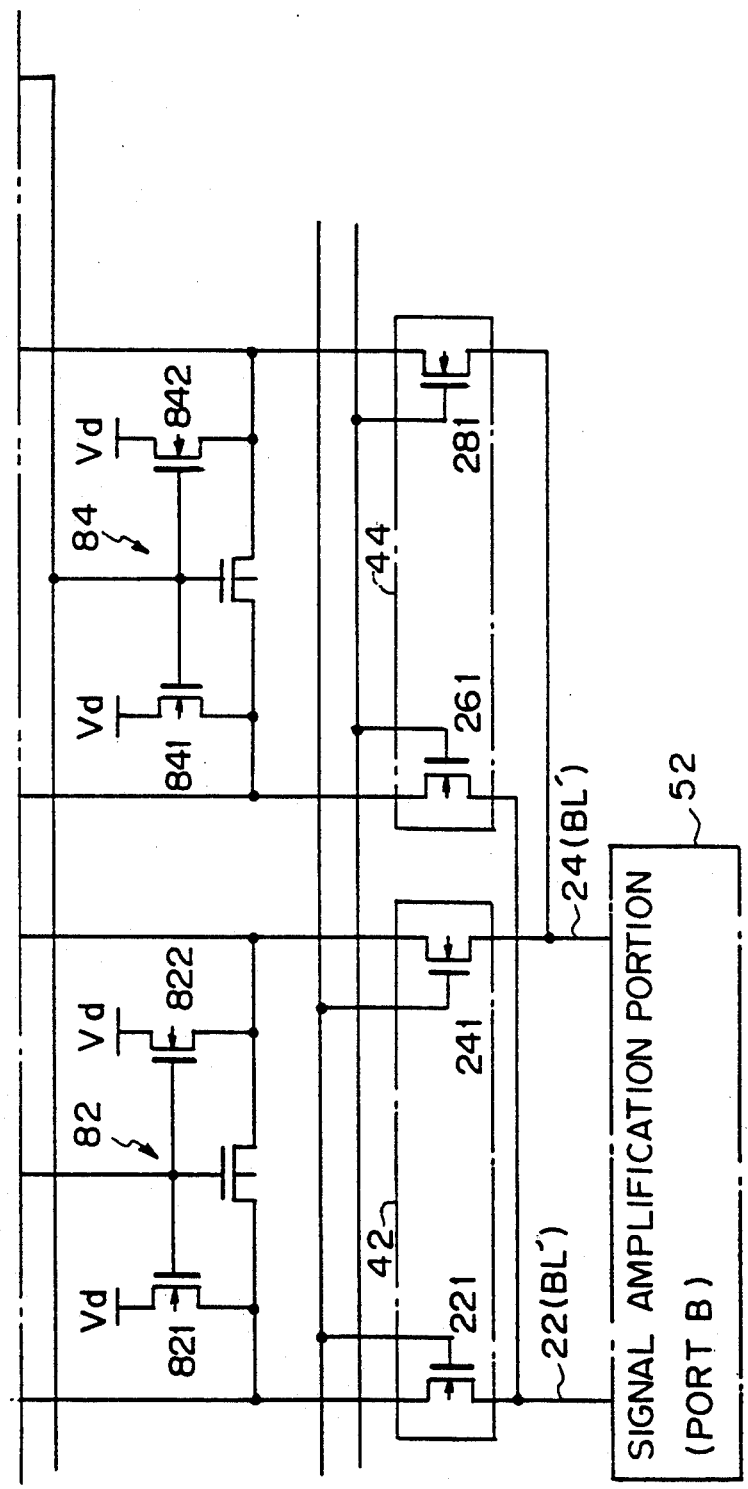

In the device of FIG. 11, a short-circuiting member is constituted by an equalizing circuit 81, 82, 83, or 84 constituted by, for example, a switching element 813 for short-circuiting bit line pair and switching elements 811 and 812 connected to the common voltage source Vd for making the potential difference zero.

Where it is detected by the detection circuit 6 that the row addresses of the ports A and B coincide, and the write enable signal of one port, e.g., port A, is active, a bit line pair 22(BL') and 24($\overline{BL}'$) connected through the memory cell selected by port A is short-circuited.

In the device of FIG. 11, when one port is in the writing state, a bit line pair of the other port is brought to the same potential by a precharge, and the change to the potential for writing is made from this same potential. Thus, the time t(dw) for data writing shortened, and the operation speed of the device is increased.

I claim:

1. A semiconductor memory device in which dual ports are provided for selecting a specific memory cell from a memory cell matrix, and word lines and bit lines in the ports of the dual ports are driven independently for each port to write data into or read data from the memory cell, said device comprising:

a driving state detection means for detecting a state of driving word lines of the two ports and delivering a detection signal based on the detection, where one of the ports is in the writing state with regard to the memory cell; and bit line short-circuiting means responsive to said detection signal from said driving state detection means for realizing a short-circuit between predetermined bit lines.

2. A semiconductor memory device in which dual ports are provided for selecting a specific memory cell from a memory cell matrix, and word lines and bit lines in the ports of the dual ports are driven independently for each port to write data into or read data from the memory cell, said device comprising:

a driving state detection means for detecting the state of driving word lines of the two ports and delivering a detection signal based on the detection, where one of the ports is in the writing state with regard to the memory cell; and bit line short-circuiting means responsive to said detection signal from said driving state detection means for realizing a short-circuit between a bit line of one port and a bit line of the other port.

3. A semiconductor memory device in which dual ports are provided for selecting a specific memory cell from a memory cell matrix, and word lines and bit lines in the ports of the dual ports are driven independently for each port to write data into or read data from the memory cell, said device comprising:

a driving state detection means for detecting the state of driving word lines of the two ports and delivering a detection signal based on the detection, where one of the ports is in the writing state with regard to the memory cell; and bit line short-circuiting means responsive to said detection signal from said driving stat detection means for realizing a short-circuit of a bit line pair of the port opposite to the writing side port.

* * * * *